(12) United States Patent
Mardilovich et al.

(10) Patent No.: US 8,961,799 B2
(45) Date of Patent: Feb. 24, 2015

(54) NANO-STRUCTURED SURFACE

(75) Inventors: Peter Mardilovich, Corvallis, OR (US); Anthony M. Fuller, Corvallis, OR (US); Qingqiao Wei, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 35 days.

(21) Appl. No.: 13/878,203

(22) PCT Filed: Oct. 13, 2011

(86) PCT No.: PCT/US2011/056049
§ 371 (c)(1),
(2), (4) Date: Apr. 6, 2013

(87) PCT Pub. No.: WO2012/054281
PCT Pub. Date: Apr. 26, 2012

(65) Prior Publication Data
US 2013/0186855 A1      Jul. 25, 2013

Related U.S. Application Data

(63) Continuation-in-part of application No. PCT/US2010/053533, filed on Oct. 21, 2010.

(51) Int. Cl.
*B44C 1/22* (2006.01)
*B82Y 40/00* (2011.01)
*B81C 1/00* (2006.01)

(52) U.S. Cl.
CPC ........... *B44C 1/227* (2013.01); *B82Y 40/00* (2013.01); *B81C 1/00111* (2013.01); *B81C 2201/0149* (2013.01); *Y10S 977/70* (2013.01)
USPC ............... 216/11; 216/41; 216/58; 977/700

(58) Field of Classification Search
USPC ................. 216/41, 58, 11; 977/700
See application file for complete search history.

(56) References Cited

U.S. PATENT DOCUMENTS

| | | |
|---|---|---|
| 6,652,762 B2 | 11/2003 | Baik et al. |
| 7,384,792 B1 | 6/2008 | Wang et al. |
| 2003/0010971 A1 | 1/2003 | Zhang et al. |
| 2008/0318003 A1 | 12/2008 | Chua et al. |
| 2009/0136785 A1 | 5/2009 | Chen |
| 2013/0327645 A1* | 12/2013 | Walavalkar et al. .......... 204/543 |

OTHER PUBLICATIONS

Crouse, D. et al.; Self-Ordered Pore Structure of Anodized Aluminum on Silicon and Pattern Transfer; Appl. Phys. Lett.; vol. 76, No. 1; pp. 49-51; Jan. 3, 2000.

I. H. Park et al; Formation of Silicon Nanodot Arrays by Reactive Ion Etching Using Self-assembled Tantalum Oxide Mask; J. Ind. Eng. Chem., vol. 11, No. 4, (2005) pp. 590-593.

I.H. Park et al; Synthesis of Nanodot Arrays Using Self-assembled Niobium Oxide Nanopillar Mask by Reactive Ion Etching; Studies in Surface Science and Catalysis, vol. 159; Inha University, 2006; pp. 361-364.

(Continued)

*Primary Examiner* — Shamim Ahmed
(74) *Attorney, Agent, or Firm* — Hewlett-Packard Patent Development

(57) ABSTRACT

A method of forming a nano-structured substrate is provided, the method comprising including forming non-integral nano-pillars on a substrate surface and directionally etching the substrate surface using the non-integral nano-pillars as a mask to form integral nano-structures in the substrate.

15 Claims, 4 Drawing Sheets

(56) References Cited

OTHER PUBLICATIONS

Ik Hyun Park et al; Formation of Si Nanostructures Using Dry Etching With Self-Organized Metal Oxide Nanopillar Masks; Inha Univerity; Issue No. 1; vol. 78; pp. 245-253 ; 2006.

Sai, H. et al., Antireflective Subwavelength Structures on Crystalline Si Fabricated Using Directly Formed Anodic Porous Alumina Masks, Appl. Phys. Lett., vol. 88, No. 20. pp. 20116-1-201116-3; May 18, 2006.

Mozalev et al.; Nucleation and Growth of the Nanostructured Anodic Oxides on Tantalum and Niobium Under the Porous Alumina Film; Electrochimica Acta; vol. 48, pp. 3155-3170; Sep. 30, 2003.

W.W. Kuo et al; Sub-10 Nm Fabrication of Large Area Periodi Nanopillars,; Mat. Res. Soc. Symp. Proc., vol. EXS-2, 2004 Materials Research Society.

* cited by examiner

NANO-STRUCTURED SURFACE

BACKGROUND

Nano-structures are suitable for use in a wide variety of applications, including applications for shock absorption, promoting adhesion, tuning surface wettability, and micro- or nano-fluidic filtration, among other applications. Nano-scale structures may be formed on a surface using a template formed on a surface, and then filling pores in the template with a select material. Once the pores are sufficiently filled, the template may be removed to expose nano-structures on and above the surface.

BRIEF DESCRIPTION OF THE DRAWINGS

Features and advantages of embodiments of the present disclosure will become apparent with reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1:
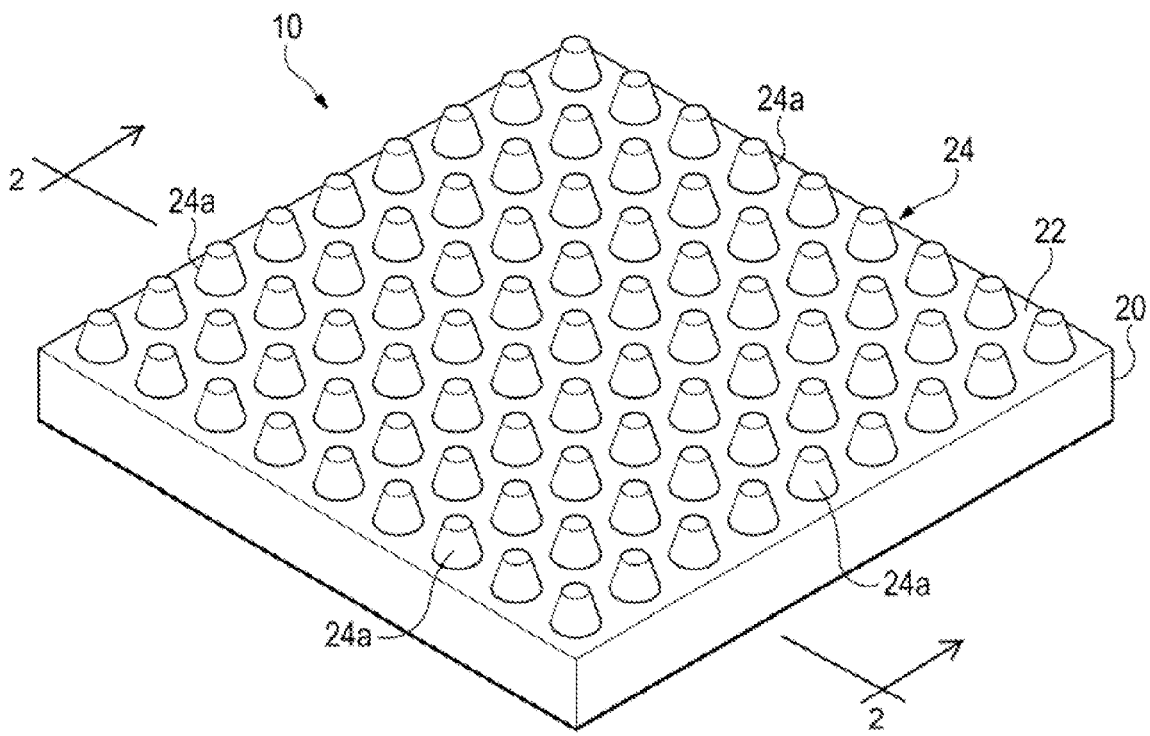
FIG. 1 is a simplified perspective view of an article including a nano-structured surface formed in accordance with an embodiment of the present invention.

Referring initially to FIG. 1, an article 10 is shown, the depicted article including a substrate 20 having a nano-structured surface 22. In the depicted example, nano-structured surface 22 will be seen to define a nano-structure array 24 that includes a plurality of nano-structures 24a integral with substrate 20.

As will be described below, such integral nano-structures 24a may be formed by applying a separate nano-structured layer to the substrate, and using the nano-structured layer as a hard mask. Nano-features 24a thus may be formed in substrate surface 22 regardless of the material from which substrate 20 is formed.

The methods disclosed herein may be used to control various dimensions of the nano-structures. For example, placement of nano-structures in the nano-structure array may be selectively controlled by controlling formation of the nano-structured layer that acts as a hard mask. This, in turn, may be controlled via the methods disclosed herein. Similarly, the size of gap formed between adjacent nano-structures may be controlled, and the geometry and/or dimensions of the nano-structures (such as their height, diameter, shape, etc.) may be controlled.

Figure 2:
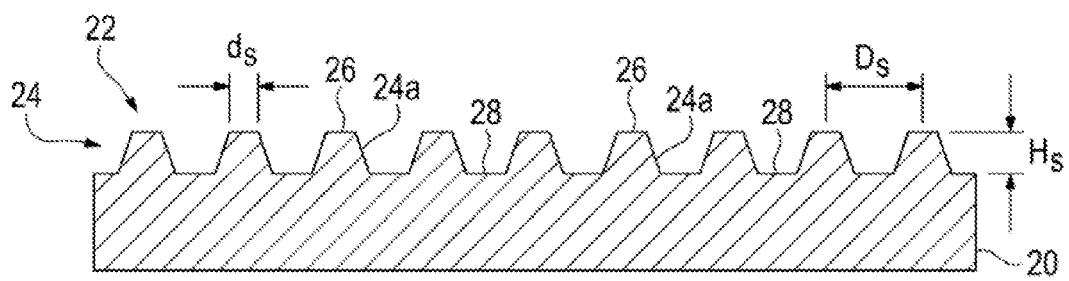
FIG. 2 is a somewhat schematic cross-sectional view of the article shown in FIG. 1, having a nano-structured surface, taken generally along line 2-2 of FIG. 1.

In one example, nano-structures 24a are elongate structures that extend orthogonal to a plane defined by substrate 20. The geometry of the nano-structures may be controlled so that the nano-structures each have a substantially columnar shape. As shown in FIGS. 1 and 2, the nano-structures may be substantially uniform in height ($H_S$), and the pitch of the nano-structures (the center-to-center distance between nano-structures ($D_S$)) may be substantially uniform. Nano-structures 24a thus may be substantially uniformly spaced across at least a portion of surface 22, providing a substantially uniformly nano-structured surface. Dimensions of nano-structures generally will vary by less than 10% to 20% (for nanometer scale dimensions).

In the depicted example, nano-structures 24a are generally columnar, each characterized as having a nominal diameter ($d_S$) (corresponding to nano-structure thickness) and a height ($H_S$). The nano-structures thus may terminate in distal ends 26, which collectively define a plane substantially uniformly spaced above a base surface 28 from which the nano-structures extend.

Although columnar nano-structures are shown for illustrative purposes, the nano-structures can have other geometries, which may be determined at least in part by parameters of the fabrication process described below. For example, height, diameter, shape, and spacing between nano-structures may be controlled. It thus will be appreciated that the fabrication process may be manipulated to tune nano-structure geometry and spacing to accommodate a variety of purposes.

FIGS. 3A-3E depict an article 10 throughout fabrication of a nano-structured substrate as described herein. As shown, a substrate 20 thus may be adapted, through the present method, to define an integral nano-structured surface 22.

Figure 3A:
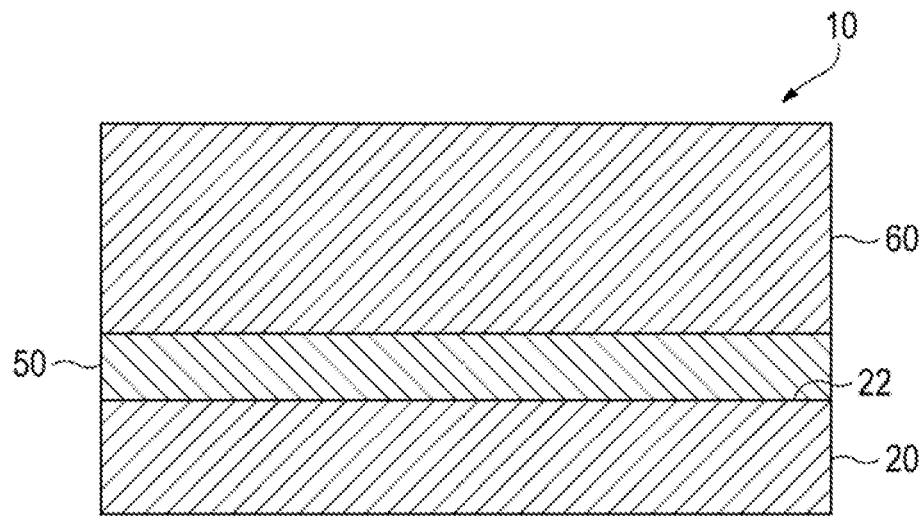
FIGS. 3A through 3E schematically depict a method of forming a nano-structured surface in accordance with an embodiment of the present invention.

Referring initially to FIG. 3A, fabrication begins with a substrate 20. Substrate 20 may be selected based, at least in part, on the desired purpose of the nano-structured surface. In some examples, substrate 20 may be a substantially planar silicon wafer. Substrate 20, however, similarly may be formed from other materials, e.g., glass, quartz, alumina, stainless steel, plastic, and/or the like, and may take any of a variety of forms, including a multilayer structure (such as a silicon wafer with a thin film top layer) wherein the top layer defines a nano-structured surface as described herein.

As shown, a first oxidizable material (also referred to as an oxidizable nano-pillar material) is deposited on a surface 22 of substrate 20 to form a layer of first oxidizable material 50. The first oxidizable material layer 50 may be formed using any suitable deposition technique known in the art. Some non-limiting examples of suitable deposition techniques include physical vapor deposition (PVD) (such as sputtering, thermal evaporation and pulsed laser deposition), atomic layer deposition (ALD), or, in some instances, chemical vapor deposition (CVD).

In some examples, the first oxidizable material layer 50 may be formed of a metal or metal alloy that forms a dense metal oxide after electrochemical oxidation. Such dense metal oxides are suitable for use as a hard mask, as will be described further below. Suitable oxidizable materials include oxidizable refractory metals such as tantalum (Ta), niobium (Nb), titanium (Ti), tungsten (W), or their alloys. Such oxidizable materials can be electrochemically and/or thermally oxidized, and have expansion coefficients (the ratio between thickness of the grown oxide and thickness of the consumed material) that are greater than 1.

In the present example, first oxidizable material layer 50 is formed of tantalum (Ta), which has been found suitable for use in the method described herein. The example first oxidizable material layer thus also may be referred to herein as the "Ta layer". The Ta layer may have a thickness selected such that the tantalum will be fully oxidized upon formation (by electrochemical oxidation) of nano-pillars (which formation will be described in further detail below). The Ta layer, however, may have any suitable thickness that will produce enough oxide to form nano-pillars sufficient to act as a hard mask (even if the underlying Ta layer is not fully oxidized). In some examples, the thickness of the Ta layer may be approximately 10 to 200 nanometers.

Referring still to FIG. 3A, it will be noted that a second oxidizable material (also referred to as an oxidizable template material) is deposited on the Ta layer to form a layer of second oxidizable material 60. The second oxidizable material layer may be a material selected to produce a porous oxide (as described below), with pours that correspond to the nano-pillars to be formed. The second oxidizable material may be aluminum (Al), or may be an aluminum alloy such as an alloy having aluminum as the main component. Second oxidizable material layer 60 also may be referred to herein as the "Al layer". The Al layer may have any suitable thickness that will produce (by electrochemical oxidation) enough oxide to form a template sufficient to define nano-pillars suitable for acting as a hard mask for use in producing the desired nano-structured surface, as will be described below. In some examples, the thickness of the Al layer may be approximately 100 to 1000 nanometers.

Deposition of the Al layer on the Ta layer may be accomplished using any suitable deposition technique known in the art. Some non-limiting examples of suitable deposition techniques include physical vapor deposition (PVD) (such as sputtering, thermal evaporation and pulsed laser deposition.

Figure 3B:
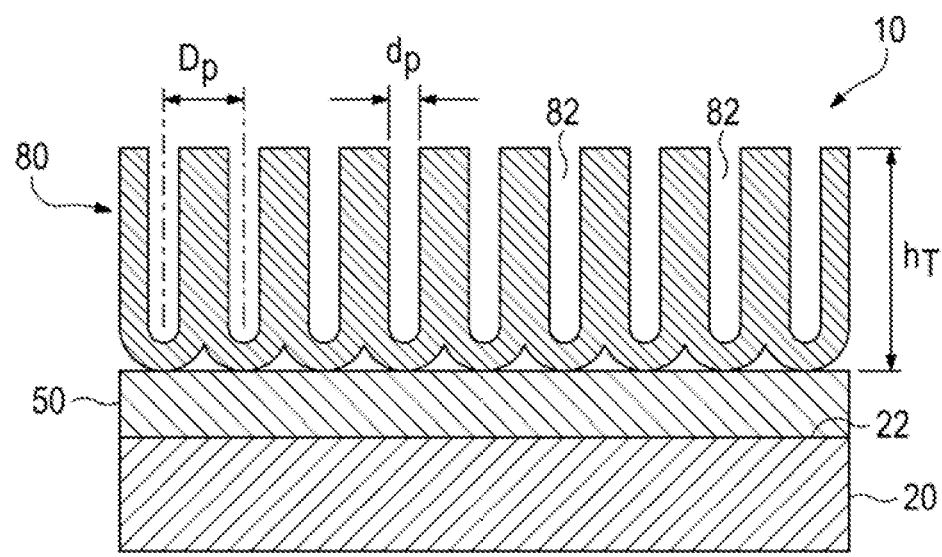

As shown generally in FIG. 3B, the multi-layer structure of FIG. 3A may be further processed to form a nano-pillar template 80 on substrate 20. The nano-pillar template defines a plurality of nano-pores 82, each having a first width (indicated as nano-pore diameter ($d_p$), in the present example). Such nano-pores are suitable for use in forming nano-pillars 40 (FIG. 3C) for subsequent use in defining nano-structures 24a (FIG. 3E) on the substrate surface, as will be described herein.

In some examples, further processing includes a first anodization process whereby Al layer 60 (FIG. 3A) is anodized to define a plurality of substantially uniform, cylindrical nano-pores 82. Such nano-pores may be formed by completely anodizing the Al layer (as shown in FIG. 3B) so as to produce a nano-structure template 80 in the form of a layer of porous oxide (e.g., anodic porous alumina, $Al_2O_3$) with nano-pores 82. Complete anodization refers to the oxidation of substantially the entire Al layer so as to allow anodization of underlying first oxidizable material layer 50, as will be described below.

Anodization (i.e., electrochemical oxidation) is a process of forming an oxide layer on a material by making the material the anode in an electrolytic cell and passing an electric current through the cell. For anodization of aluminum, as in the present example, applied voltage may be kept constant at a voltage within a range of about 10 V to 200 V. In some examples, the first anodization process may occur at a voltage of about 30 V As indicated generally above, it is possible to adjust geometry by adjusting parameters of the fabrication process. For example, geometry of the nano-structure template 80 may be adjusted by varying one or more of anodization voltage, current density and electrolyte. Such adjustments to the first anodization process may alter nano-pore pitch ($D_p$) and/or nano-pore diameter ($d_p$), which characteristics are illustrated in FIG. 3B. For example, nano-pore pitch may be related to anodization voltage, where nano-pore pitch ($D_p$) is 2.8 nanometers per volt of anodization voltage. Nano-pore pitch ($D_p$) generally may be adjusted within a range of from about 30 nanometers to about 500 nanometers. Nano-pore diameter ($d_p$) generally may be adjusted within a range of from about 10 nanometers to about 350 nanometers.

Anodization can be performed at constant current (galvanostatic regime), at constant voltage (potentiostatic regime) or at some combination of these regimes. Nano-pore diameter ($d_p$) is proportional to anodization voltage. Accordingly, a potentiostatic regime may be employed to produce a porous substrate with nano-pores having substantially uniform nano-pore diameter ($d_p$). Substantially uniform nano-pores 82, in turn, will yield substantially uniform nano-pillars 40, as will be described below.

The first anodization process may be carried out by exposing Al layer 60 to an electrolytic bath containing an oxidizing acid such as sulfuric acid ($H_2SO_4$), phosphoric acid ($H_3PO_4$) oxalic acid ($C_2H_2O_4$) and/or chromic acid ($H_2CrO_4$). The electrolyte may be present, for example, in a water-based solution. The voltage applied during the first anodization process may be selected based on the electrolyte composition. For example, the voltage may range from 5-25V for an electrolyte based on sulfuric acid, 10-80V for an electrolyte based on oxalic acid, and 50-150V for an electrolyte based on phosphoric acid. The particular voltage used will depend on the desired pore diameter (and the suitability of such voltage for the electrolyte).

Nano-pore diameter ($d_p$) also is related to the nature of the electrolyte used. Accordingly, an electrolyte may be selected to achieve a particular desired nano-pore diameter ($d_p$). As non-limiting examples, nano-pores 82 of the following sizes may be obtained using the following electrolytes: nano-pore diameters ($d_p$) of about 20 nanometers may be obtained using $H_2SO_4$ (in a water-based solution) as the electrolyte; nano-pores diameters ($d_p$) of about 40 nanometers may be obtained using $C_2H_2O_4$ (in a water-based solution) as the electrolyte; and nano-pores diameters ($d_p$) of about 120 nanometers may be obtained using $H_3PO_4$ (in a water-based solution) as the electrolyte.

In one example, nano-structure template 80 is formed by anodization of the Al layer 60 in a 4% solution of oxalic acid ($C_2H_2O_4$), at a voltage of 30 Volts until substantially the entire Al layer is consumed. For a suitably thick Al layer, the resulting nano-structure template 80 will define nano-pores 82 that are approximately 30 nanometers wide, and that will allow oxidation of underlying first oxidizable material layer 50. The nano-structure template should have a template height ($h_T$) sufficient to allow complete growth of a nano-pillars 40 (FIG. 3C) within the nano-pores.

After the first anodization process, the nano-pore diameter ($d_p$) may be further tuned to a target nano-pore diameter by anisotropic etching, or other suitable process (not shown). Anisotropic etching may be performed using diluted phosphoric acid (5 vol. %). The time for etching may vary, depending, at least in part, upon the desirable average diameter for the final pores. The temperature for etching may also depend upon the process, the etching rate, and the etchant used.

In some examples (not shown), prior to performing the first anodization process, the first oxidizable material layer may be patterned to precisely define locations of nano-pores 82 in the resulting nano-pillar template 80. Patterning may be accomplished via any suitable technique. The patterned layer may then be anodized, for example, by employing the patterned layer as the anode of an electrolytic cell. A suitable amount of voltage and current is then applied to the electrolytic cell for an amount of time to completely anodize the patterned layer in accordance with the first anodization process described above. This can result in substantially uniformly spaced nano-structures where the variance in spacing between nano-structures differs by less than 10% (for nanometer scale dimensions).

Figure 3C:
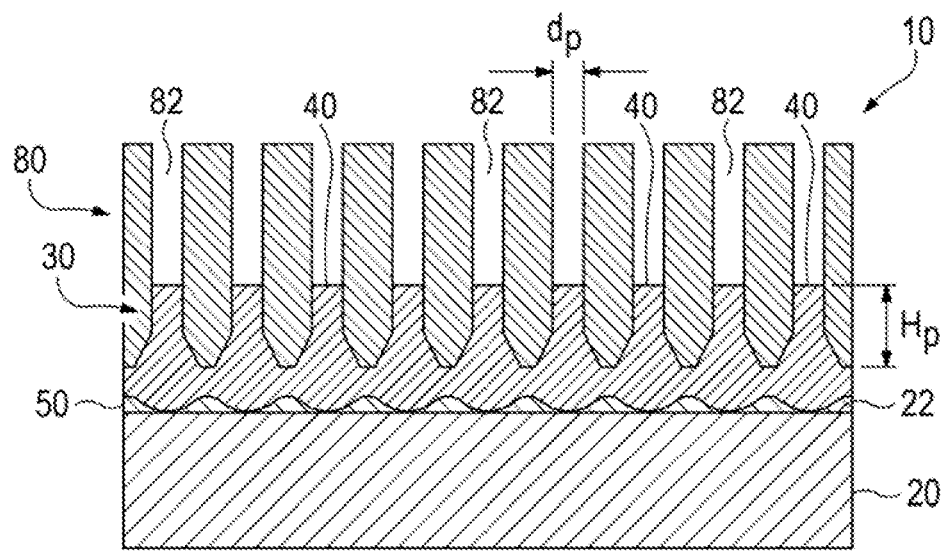

Referring now to FIG. 3C, nano-pores 82 may be at least partially filled to define nano-pillars 40 of height ($H_P$). Nano-pillars 40 may be formed via a second anodization process selected to anodize the underlying Ta layer 50. Such second anodization process will grow an oxide from the first oxidizable material (e.g., Ta), with oxide forming in the nano-pores 82 of the nano-pillar template 80 from the bottom up. The resulting oxide may take the form of a dense oxide such as anodic tantalum pentoxide ($Ta_2O_5$).

The second anodization process may be accomplished, for example, using a process similar to the first anodization process described above. More specifically, the Ta layer 50 may be anodized by employing the Ta layer as the anode of an electrolytic cell to achieve a desired oxidation of the first oxidizable material.

In some examples, nano-pillars 40 may be formed by substantially completely anodizing the Ta layer 50 so as to produce nano-pillars with little or no underlying first oxidizable material. However, complete anodization of the first oxidizable material layer is not required, as illustrated by the nominal amount of first oxidizable material remaining below the depicted nano-pillar array 30.

For oxidation of tantalum (Ta), non-limiting examples of electrolyte may include solutions containing citric acid ($C_6H_8O_7$), oxalic acid ($C_2H_2O_4$), boric acid ($H_3BO_3$), ammonium pentaborate (($NH_4$)$_2B_{10}O_{16}$×$8H_2O$), and/or ammonium tartrate ($H_4NO_2CCH(OH)CH(OH)CO_2NH_4$). It is to be understood that this type of anodization forms a dense oxide, where both the interface between the remaining first oxidizable material and the formed oxide, and the interface between the formed oxide and the electrolyte are planarized.

During anodization of the Ta layer 50, the formed oxide (in this example, tantalum pentoxide ($Ta_2O_5$)) grows through the individual nano-pores 82 defined in nano-pillar template 80 to form a nano-pillar 40 in each nano-pore. The orientation of nano-pillar 40 is generally controlled by the orientation of the nano-pores 82. In the present example, the nano-pillars 40 include conical foundations, and are substantially orthogonal to substrate 20.

The expansion coefficient of a material to be oxidized is defined as the ratio of oxide volume to consumed material volume. The expansion coefficient for oxidation of tantalum (Ta) is approximately 2.3. Accordingly, in the present example, due to the significant expansion of tantalum pentoxide ($Ta_2O_5$), and the fact that the resulting oxide ($Ta_2O_5$) is dense, the nano-pores 82 are filled from the bottom up. It will be understood that although the first oxidizable material is tantalum (Ta) in the present example, other materials with an expansion coefficient greater than 1 would similarly allow the oxidizable material to squeeze into the nano-pores 82 of nano-pillar template 80.

As indicated, the grown oxide will at least partially fill nano-pores 82 of nano-pillar template 80 to define nano-pillars 40. The geometries of the nano-pillars 40 generally will conform to the geometries of corresponding nano-pores 82, within which the nano-pillars are growing. Nano-pillars 40 thus may take the form of columns, substantially uniformly spaced across substrate 20.

In the present example, each nano-pillar has a pillar thickness that corresponds to the nano-pore diameter ($d_p$). Nano-pillars 40 are grown to a pillar height ($H_P$). Pillar height ($H_P$) may be less than template height ($h_T$) (FIG. 3B).

The geometry and/or dimensions of the nano-pillars 40 may further be controlled by adjusting one or more parameters of the anodization process. For example, the pillar height ($H_P$) will depend on the anodization voltage applied to the first oxidizable material layer 50 during its anodization. In some examples, nano-pillars are formed by anodizing the first oxidizable material at a first voltage corresponding to a target nano-pillar height ($H_P$) that may be selected to achieve a desired height ($H_S$) of nano-structures 24a, as will be described below.

Nano-pillar height ($H_P$) may be selected to avoid bending of nano-pillars during subsequent formation of nano-structures 24a. In some examples, the nano-pillars may have an aspect ratio of 3:1, meaning that the nano-pillars have a height ($H_P$) that is three times their diameter ($d_P$). The nano-structure aspect ratio may differ from the above example, but in most instances where tantalum (Ta) is chosen as the first oxidizable material, the aspect ratio will be on the order of between 1:1 and 3:1.

In one example, nano-pillars having a pillar height ($H_P$) of 90 nanometers (at a diameter ($d_p$) of approximately 30 nanometers) may be formed by anodization of Ta layer 50 in a 0.1% solution of citric acid ($C_6H_8O_7$), at a current density of 2 mA/cm$^2$ until voltage reaches 55 Volts, and for 5 minutes more at 55V. It will be appreciated that pillar height ($H_P$) may be tuned to a target pillar height by selecting a corresponding anodization voltage.

Figure 3D:
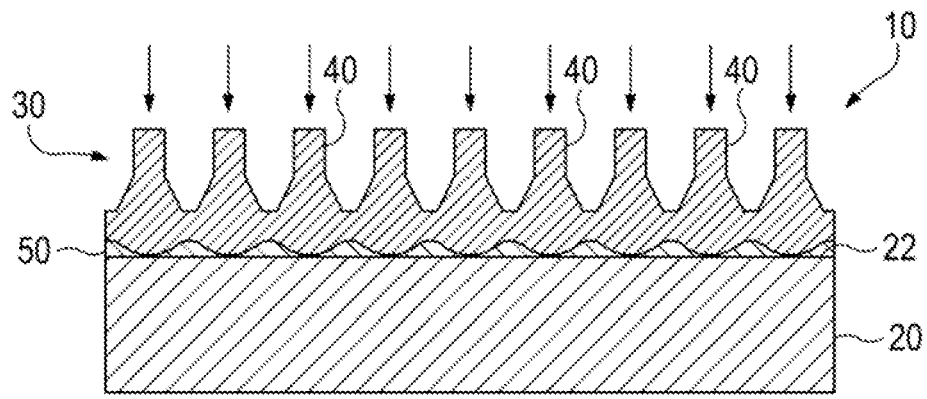

As indicated in FIG. 3D, once nano-pillars 40 are grown to the target pillar height ($H_P$), the nano-pillar template 80 may be removed to expose the fully formed nano-pillars, which define a nano-pillar array 30. The nano-pillar template 80 may be removed using a second selective etching process that will remove the nano-pillar template 80 without deleteriously affecting the nano-pillars 40, or other features of article 10. In one example, the selective etching may be performed using a selective etchant containing $H_3PO_4$ (92 g), $CrO_3$ (32 g) and $H_2O$ (200 g), at approximately 95° C. It has been found that the example tantalum pentoxide ($Ta_2O_5$) nano-pillars 40 can withstand this particular etching process for more than one hour, while the example anodic porous alumina ($Al_2O_3$) nano-pillar template 80 is etched away at a rate of about 1 micron per minute. Other selective etchants are also contemplated, dependent on the particular characteristics of the nano-pillars, and other features.

Once the nano-pillars have been exposed, the article 10 may be subjected to a directional etch (indicated by arrows in FIG. 3D) so as to remove the nano-pillars and any underlying materials to a depth determined by the particular etch parameters. Directional etching may be achieved, for example, via dry etch or ion beam etch (IBE), by applying etchant to the article along a path aligned with the formed nano-pillars.

In some examples, the directional etch may entail 2 stages. The first stage may include removing the grown oxide (e.g. tantalum pentoxide ($Ta_2O_5$)) between the nano-pillars to expose the substrate in areas between the nano-pillars. This may be accomplished by etching the grown oxide sufficient to remove the material between the nano-pillars, but not entirely remove the nano-pillars themselves. The first stage etching may be a dry etch process.

The second stage may include etching the substrate in the exposed areas to a pre-determined depth, using the remaining nano-pillars as a hard mask. Such second stage etching may be a dry etch process, and may involve an etchant different from the etchant used in the first stage etching. The nano-pillar hard mask may or may not be completely consumed by etching in the second stage. If the nano-pillar mask is not entirely consumed, and the remaining nano-pillar hard mask is to be removed, a follow-up etching process may be used. In such follow-up etching process, the etchant may be selected to remove the remaining grown oxide without significant etching of the substrate materials. This follow up etching process may be a wet etch process.

Figure 3E:
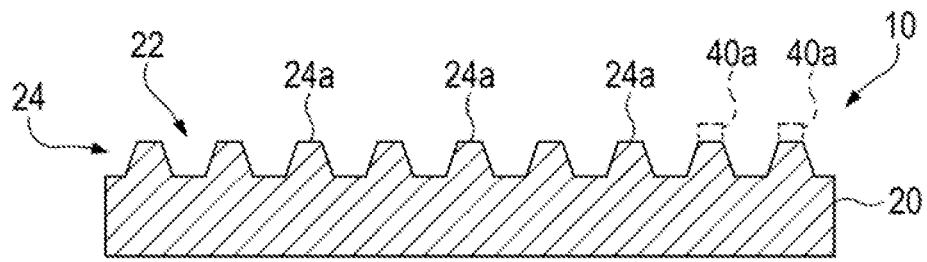

In one example, the following conditions for dry etching (reactive ion etching) of a non-anodized Ta layer (substrate) were used: tool—LAM Alliance 9600SE; He pressure—10 torr, reactive gases—$BCl_3$ (20 sccm) and $Cl_2$ (120 sccm), RF power—500 W, duration—75 sec for etching of 300 nm of Ta.

Where article 10 is directionally etched in alignment with the formed nano-pillars (normal to the substrate surface 22, in the present example), the contour of article 10 generally will be maintained as materials are etched away. In this manner, the nano-pillars will be seen to act as a hard mask so as to accommodate directional etching of corresponding nano-structures 24a into substrate 20 (FIG. 3E). Substrate 20 thus may be made to define an integral nano-structure array 24, providing substrate 20 with a nano-structured surface 22.

In some examples, the article is directionally etched until the nano-pillars are entirely removed. In other examples, the nano-pillars may be only partially removed so as to establish integral nano-structures with non-integral caps 40a (shown as an alternative nano-structured substrate configuration using dashed lines in FIG. 3E). The caps may be defined by remaining portions of the dense oxide nano-pillars, and/or by features electrochemically deposited on the nano-pillars prior to directional etch.

As noted in the foregoing examples, nano-pillars 40 may be formed from a material that is different from the material forming substrate 20. Correspondingly, the etch rate of nano-pillars 40 may be different from the etch rate of substrate 20.

In some examples, the etch rate of the substrate may be faster than the etch rate of the nano-pillars. Nano-structures 24a thus may be formed in the substrate surface without removing the nano-pillars 40 that serve as a hard mask during directional etching. In such examples, the remaining hard mask nano-pillars 42 may be removed by selective etching process that will remove the grown oxide, but not the substrate. The contour of nano-pillar array 30 will be maintained in that the positions of nano-structures 24a conform to the positions of nano-pillars 40.

In other examples, directional etching may be performed in a single stage wherein the etch rate of the substrate is slower than the etch rate of the nano-pillars (for the particular directional etchant used). This may result in nano-structures 24a that are shorter than nano-pillars 40.

The nano-structure height ($H_S$) will be determined, at least in part, based on the parameters of the directional etch. Nano-structure height ($H_S$) may be impacted by the pillar height ($H_P$), and by the materials used to form the nano-pillar hard mask and the substrate (e.g., where the substrate etch rate differs from the nano-pillar etch rate). Furthermore, where caps are employed on the nano-pillars, such caps may be differently resistant to directional etch, and thus may be used to further tune nano-structure height.

Figure 4:
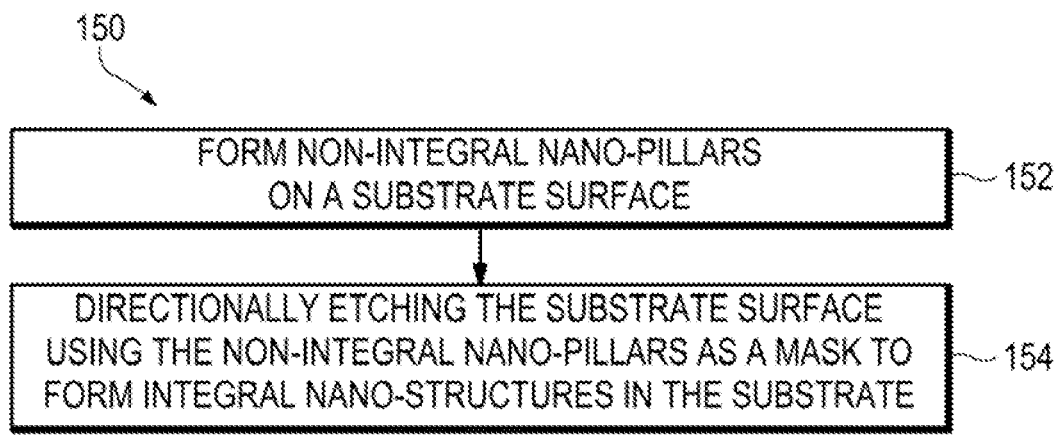
FIG. 4 is a flowchart showing a method of forming a nano-structured surface in accordance with an embodiment of the present invention.

FIG. 4 shows a high-level flowchart 150 of a method of forming a nano-structured substrate, as described herein. The method generally includes: (1) forming non-integral nano-pillars on a substrate surface; and (2); directionally etching the substrate surface using the non-integral nano-pillars as mask for forming integral nano-structures in the substrate.

More particularly, at 152, non-integral nano-pillars are formed on a substrate surface. At 154, the substrate surface is directionally etched using the nano-pillars as a mask to form integral nano-structures in the substrate. In some examples, the non-integral nano-pillars may be formed by applying a template to the substrate surface, at least partially filling the template with a pillar material to define nano-pillars, and removing the template to expose the nano-pillars. The nano-pillars may be formed of a dense oxide, and may have an etch rate that is different from the substrate etch rate for the selected etchant.

The template may be formed using a layer of a second oxidizable material overlying a layer of a first oxidizable material. The second oxidizable material may be anodized to form a template having nano-pores. The template may overlie the first oxidizable material.

Partially filling the nano-pores may include anodizing the layer of first oxidizable material to grow oxide from the first oxidizable material into the nano-pores of the template.

Figure 5:
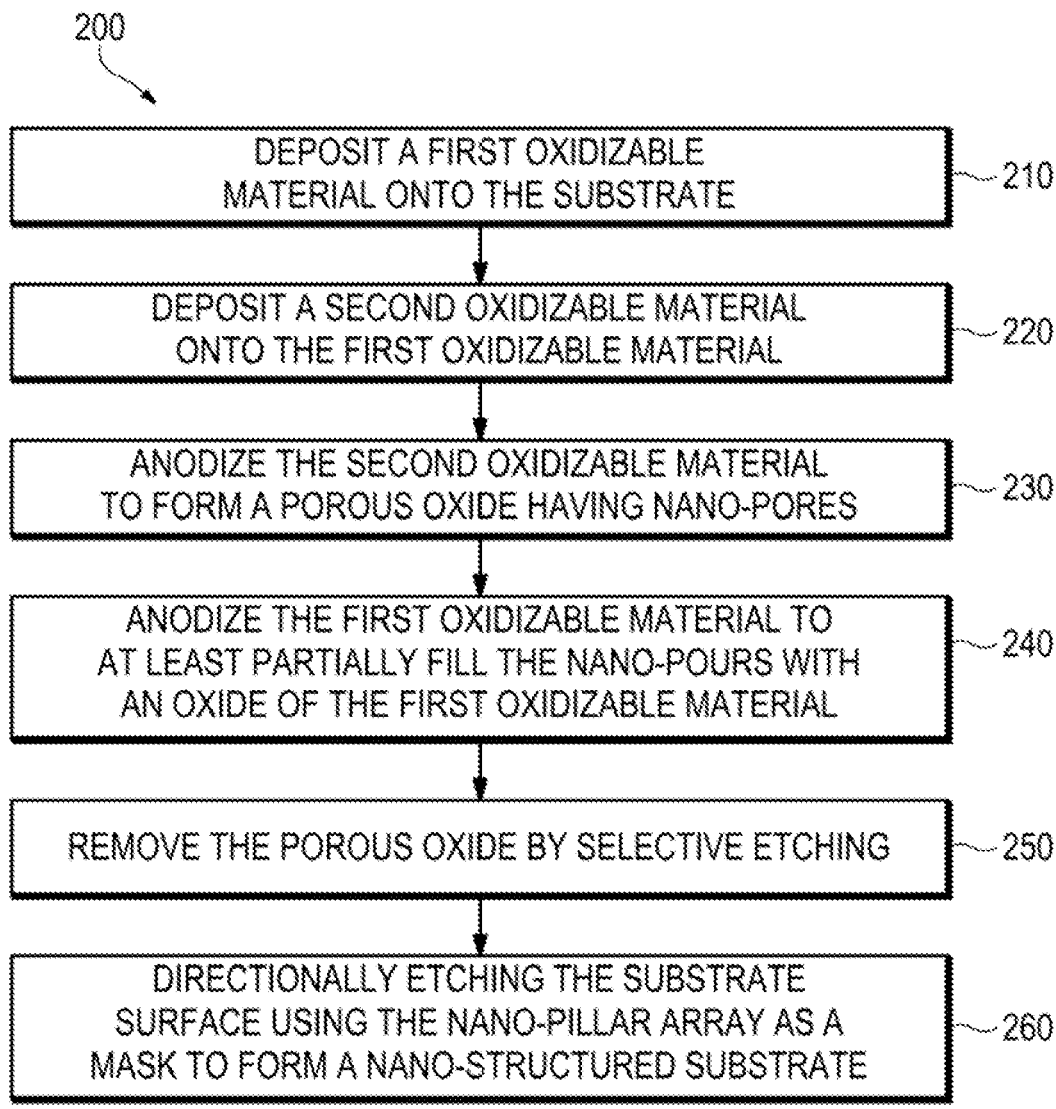
FIG. 5 is a flowchart showing a method of forming a nano-structured surface in accordance with another embodiment of the present invention.

FIG. 5 shows a flowchart 200 of a method of forming a nano-structured substrate, as described herein. The method generally includes: (1) depositing a first oxidizable material onto a substrate; (2) depositing a second oxidizable material onto the first oxidizable material; and (3) anodizing the second oxidizable material to form a porous oxide having nano-pores that extend through the porous oxide to expose portions of the first oxidizable material; (4) anodizing the first oxidizable material so as to at least partially fill the nano-pores in the porous oxide with a pillar material including an oxide of the first oxidizable material, thereby forming a nano-pillar array; (5) removing the porous oxide by selective etching; (6) directionally etching the substrate using the nano-pillar array as a mask for forming integral nano-structures in the substrate.

More particularly, at 210, a first oxidizable material (which may take the form of Tantalum (Ta)) is deposited onto a substrate. At 220, a second oxidizable material is deposited onto the first oxidizable material. At 230, the second oxidizable material is anodized to form a porous oxide having nano-pores. At 240 the first oxidizable material is anodized so as to at least partially fill the nano-pores in the porous oxide with an oxide of the first oxidizable material, thereby forming a nano-pillar array. At 250, the porous oxide is removed by selective etching, thereby yielding a nano-pillar array. At 260, the substrate is directionally etched, using the nano-pillar array as a mask.

Although the present invention has been described with reference to certain representative examples, various modifications may be made to these representative examples without departing from the scope of the appended claims.

What is claimed is:

1. A method of forming a nano-structured substrate, the method comprising:
    forming a template on a substrate surface, the template comprising elongate nano-pores with substantially uniform cross-sectional shapes along a length of the nano-pores;
    forming non-integral nano-pillars on the substrate surface, the non-integral nano-pillars comprising elongate upper portions having shapes conforming to the cross-sectional shapes of the elongate nano-pores; and
    directionally etching the substrate surface using the non-integral nano-pillars as a mask to form integral nano-structures in the substrate.

2. The method of claim 1, wherein forming the non-integral nano-pillars includes:
    at least partially filling the nano-pores with a pillar material to define the non-integral nano-pillars; and
    removing the template.

3. The method of claim 1, wherein forming the template includes:
    forming a layer of oxidizable template material; and
    anodizing the layer of oxidizable template material to form the nano-pores.

4. The method of claim 2, wherein at least partially filling the nano-pores includes:
forming a layer of oxidizable nano-pillar material; and
anodizing the layer of oxidizable nano-pillar material to grow oxide from the oxidizable nano-pillar material into the nano-pores, thereby forming the non-integral nano-pillars in the nano-pores.

5. The method of claim 1, wherein the non-integral nano-pillars are of substantially uniform height.

6. The method of claim 1, wherein directionally etching the substrate surface is performed in alignment with the non-integral nano-pillars.

7. The method of claim 1, wherein directionally etching the substrate surface is performed by dry etching of the substrate surface.

8. The method of claim 1, wherein directionally etching the substrate surface is performed by ion beam etching of the substrate surface.

9. The method of claim 1, wherein the non-integral pillars have a nano-pillar etch rate different than a corresponding substrate etch rate.

10. The method of claim 1, wherein the substrate is formed of silicon.

11. The method of claim 10, wherein the non-integral nano-pillars are formed of tantalum pentoxide ($Ta_2O_5$).

12. A method of forming a nano-structured substrate, the method comprising:
forming a template on a substrate surface, the template comprising elongate nano-pores;
at least partially filling lengths of the elongate nano-pores with a pillar material to create nano-pillars on the substrate surface that extend into the nano-pores of the template and have a cross-sectional shape conforming to cross-sectional dimensions of the elongate nano-pores;
removing the template to expose the nano-pillars; and
directionally etching the substrate surface in alignment with the nano-pillars.

13. The method of claim 12, wherein directionally etching the substrate surface is performed by dry etching the substrate surface.

14. The method of claim 12, wherein directionally etching the substrate surface is performed by completely etching the nano-pillars to define integral nano-structures in the substrate surface.

15. A method of forming a nano-structured substrate, the method comprising:
depositing a first oxidizable material onto a substrate surface;
depositing a second oxidizable material onto the first oxidizable material;
anodizing the second oxidizable material to form a porous oxide having elongate nano-pores that extend through the porous oxide to expose portions of the first oxidizable material, the elongate nano-pores having substantially uniform cross-sectional shapes along their length;
anodizing the first oxidizable material so as to partially fill the elongate nano-pores in the porous oxide with a pillar material including an oxide of the first oxidizable material, the pillar material to conform to a shape of the elongate nano-pores thereby forming an array of nano-pillars having upper elongate portions with dimensions corresponding to the elongate nano-pores, the array of nano-pillars having a substantially uniform height on the substrate surface;
removing the porous oxide by selective etching, thereby yielding a substantially planar array of nano-pillars on the substrate surface; and
directionally etching the substrate surface to define an integral array of nano-structures in the substrate surface.

* * * * *